(12) United States Patent
Cox et al.

(10) Patent No.: US 6,320,179 B1
(45) Date of Patent: Nov. 20, 2001

(54) DEVICE NOISE MEASUREMENT SYSTEM

(75) Inventors: Michael Cox, Bromley; Nigel Copner, Malvern, both of (GB)

(73) Assignee: The Secretary of State for Defence in Her Britanic Majesty's Government of the United Kingdom of Great Britain and Northern Ireland, Farnborough (GB)

( * ) Notice: Subject to any disclaimer, the term of this patent is extended or adjusted under 35 U.S.C. 154(b) by 0 days.

(21) Appl. No.: 09/284,634

(22) PCT Filed: Oct. 13, 1997

(86) PCT No.: PCT/GB97/02814

§ 371 Date: Apr. 15, 1999

§ 102(e) Date: Apr. 15, 1999

(87) PCT Pub. No.: WO98/19173

PCT Pub. Date: May 7, 1998

(30) Foreign Application Priority Data

Oct. 26, 1996 (GB) .................................... 9622338

(51) Int. Cl.⁷ ............... H01J 40/14; G01J 1/44; G01J 1/42

(52) U.S. Cl. .................. 250/214 A; 250/214 C; 356/226; 356/222

(58) Field of Search ............... 250/214 A, 214 C; 356/222, 226; 359/110

(56) References Cited

U.S. PATENT DOCUMENTS

| | | | |
|---|---|---|---|
| 4,218,140 | * | 8/1980 | Johnston et al. .................. 356/226 |
| 5,087,808 | * | 2/1992 | Reed .................................. 50/214 R |
| 5,534,996 | | 7/1996 | Mori et al. . | |

OTHER PUBLICATIONS

M. Puleo: "Uktra high sensitivity technique for characterisation of laser diode intensity noise in the GHz range", CSELT Technical Reports, vol. 17, No. 3, Jun. 1989, Italy, pp. 199–200, XP002053812 see the whole document.

Goobar E F Et Al: "Intensity Noise and Facet Correlation in Fabry–P Rot Laser Diodes with Facet Reflectivities" Applied Physics Letters, vol. 66, No. 25, Jun. 19, 1995, pp. 3419–3421, XP000520301, see pp. 3420, left–hand column; figure 1.

(List continued on next page.)

*Primary Examiner*—Frank G. Font
*Assistant Examiner*—Zandra Smith
(74) *Attorney, Agent, or Firm*—Nixon & Vanderhye P.C.

(57) ABSTRACT

A system and method for determining noise power levels across a range of frequencies of the optical signal output from a device operating at a specified optical power and drive current and, in particular, for determining relative intensity noise values (RIN). The system may comprise a reference laser for generating an optical reference signal and a photodetector for converting the optical signal output from the reference laser and the device under test into equivalent electrical signals. The system also comprises means for measuring ac and dc components of the electrical signals output from the photodetector. The system may be used to measure RIN levels to an accuracy of less than 1 dB. Such measurements are of particular importance in the field of fiber optic telecommunications. The reference laser is shot noise limited in the frequency range of interest, typically between 20 MHz and 20 GHz, and has a narrow linewidth, typically less than 5 kHz. A shot noise limited reference laser signal may be achieved by means of optically attenuating a higher power reference laser signal to the required lower optical power. The incorporation of a reference laser enables a simple calibration process to take account of factors such as the responsivity, gain and resolution bandwidth of the system apparatus across the whole measurement range.

21 Claims, 1 Drawing Sheet

OTHER PUBLICATIONS

I. Joindot: "Electrical measurement method for noise parameter of optical fibre amplifier by shot noise reference" OFMC 1995 Third Optical Fibre Measurement Conference, Paper V. Feb. 1985, vol. 1, Sep. 25, 1995, p. 1–4 XP002053813, see the whole document.

Patent Abstracts of Japan, vol. 014, No. 472 (P–1116), Oct. 15, 1990, & JP 02 189474 A (Fujitsu LTD), Jul. 25, 1990, see abstract.

* cited by examiner

DEVICE NOISE MEASUREMENT SYSTEM

BACKGROUND OF THE INVENTION

The invention relates to a system which may be used to measure the noise levels of laser devices, including continuous wave and pulsed lasers and, in particular, semiconductor laser diode devices such as those used in telecommunications. The system may be used to measure relative intensity noise (RIN) levels. RIN measurements are of particular importance in the field of fibre optic communications.

Spurious, random laser omissions cause intensity fluctuations in the output from laser sources. These fluctuations form the noise floor which varies with frequency and peaks at the relaxation resonance of the laser. The location of the relaxation resonance, intensity noise peak, is directly related to the maximum modulation rate of the laser. Interaction between the optical field in the laser and the injected-electron density, due to the bias current, causes the relaxation resonance to vary as a function of the bias current.

An important parameter in evaluating both laser and system performance for broadband digital and analogue systems is the relative intensity noise (RIN). RIN is the ratio of the mean-squared-intensity-fluctuation spectral density of the optical power output to the square of the average optical power. Some known measurement systems for measuring RIN are based around the use of a photodetector diode, a high gain amplifier and an electrical spectrum analyser. The optical laser energy is transferred to electrical energy by the photodetector diode and is amplified to enable low level intensity noise to be measured by the spectrum analyser.

Existing systems for measuring RIN of a laser are described in the following references; U.S. Pat. No. 5,534,996 and M. Puleo, "Ultra-high sensitivity technique for characterisation of laser diode intensity noise in the GHz range", CSELT Technical Reports, vol. 17, no. 3, June 1989, Italy pp 199–200.

One of the disadvantages of existing systems is that the frequency response and linearity of the photodetector, amplifier and spectrum analyser must be well characterised to obtain accurate measurements across a useful, wide frequency range, typically between 20 MHz and 20 GHz. Furthermore, factors such as mismatch losses, detector capacitance and spectrum analyser amplitude errors also need to be accounted for and this makes system calibration complex and time consuming.

JP A 02 189 474 describes an apparatus for measuring the noise of an optical receiver, as opposed to an optical source, and is general background to the present invention.

The present invention relates to a system and method for measuring noise levels of laser devices. In particular, the system may be used to measure relative intensity noise levels for semiconductor laser diodes such as those used in telecommunications. The system design is such that system calibration can be calculated simply and frequently, reducing systematic errors and calibration costs. Using this system, RIN measurements with an accuracy of less than 1 dB may be achieved across a frequency range of between 10–20 MHz and 20 GHz.

SUMMARY OF THE INVENTION

According to one aspect of the invention, a system for measuring one or more noise contributions to an optical output signal, $OPT_{DUT}$, from a device comprises;

means for generating a broadband, substantially shot noise limited optical reference signal, $OPT_{REF}$, detection means for receiving the optical signals, $OPT_{DUT}$ and $OPT_{REF}$, and converting said optical signals into equivalent electrical signals, $ELEC_{DUT}$ and $ELEC_{REF}$ respectively, each comprising an ac component and a dc component, wherein the optical signals $OPT_{REF}$ and $OPT_{DUT}$ are such that the dc components of the electrical signals, $ELEC_{DUT}$ and $ELEC_{REF}$, are substantially equal, means for separating the ac components and the dc components of the electrical signals, $ELEC_{DUT}$ and $ELEC_{REF}$, means for measuring the dc components of the electrical signals, $ELEC_{DUT}$ and $ELEC_{REF}$, means for amplifying the ac components of the electrical signals and means for measuring the amplified ac components of the electrical signals at a plurality of frequencies, whereby the measurement of at least one of the ac components or dc components of the electrical signals, $ELEC_{DUT}$ and $ELEC_{REF}$, provides an indication of one or more of the noise contributions to the optical output signal, $OPT_{DUT}$.

In one embodiment of the invention, the system may comprise means for generating a substantially shot noise limited optical reference signal, $OPT_{REF}$, having a linewidth less than a lower frequency limit and wherein the system also comprises means for measuring the amplified ac components of the electrical signals at a plurality of frequencies above the lower frequency limit.

In a preferred embodiment, the system also comprises first optical isolation means through which the optical signal, $OPT_{DUT}$, is transmitted so as to minimise reflection of the optical signal $OPT_{DUT}$. In a further preferred embodiment the system also comprises second optical isolation means through which the optical signal, $OPT_{REF}$, is transmitted so as to minimise reflection of the optical signal $OPT_{REF}$.

For example, the system may comprise at least one of a first free space optical isolator component and a first fibre optical isolator component through which the optical signal, $OPT_{DUT}$, is transmitted and at least one of a second free space optical isolator component and a second fibre optical isolator component through which the optical signal, $OPT_{REF}$, is transmitted.

The means for generating an optical reference signal, $OPT_{REF}$, may comprise a reference laser, for example a diode pumped Er doped glass ring laser. Alternatively, the system may comprise an Erbium doped fibre amplifier and a narrowband filter so as to yield a flat noise spectrum up to a frequency limit determined by the narrowband filter.

The means for generating an optical reference signal may further comprise attenuation means for attenuating the optical signal output from the reference laser, $OPT_{REF}$. The attenuation means may also be used to optically attenuate the optical signal output from the device, $OPT_{DUT}$. The attenuation means may be an optical attenuator capable of providing an attenuation of between 0 and 60 dB.

The detection means may be a photodetector and the means for measuring the amplified ac component of the electrical signal may be a spectrum analyser.

The means for amplifying the ac components of the electrical signals may be an amplifier capable of providing an amplification of between 10 dB and 50 dB, and more typically between 30 dB and 50 dB. The means for measuring the dc components of the electrical signals may be a voltmeter.

According to another aspect of the invention, a method for determining the device noise power contribution, $N_L$, to the total noise power, $N_T$, of an optical signal, $OPT_{DUT}$, output from a device, having a wavelength $\lambda$, using apparatus contributing a thermal noise power, $N_{TH}$, to the total noise power, $N_T$, said total noise power also comprising a shot noise power contribution, $N_Q$, comprises the steps of;

(i) generating a broadband, substantially shot noise limited optical reference signal, $OPT_{REF}$, (ii) detecting the optical signals, $OPT_{DUT}$ and $OPT_{REF}$, and converting said optical signals into equivalent electrical signals, $ELEC_{DUT}$ and $ELEC_{REF}$ respectively, using detection means, wherein $ELEC_{DUT}$ and $ELEC_{REF}$ each comprise an ac component and a dc component, wherein the dc components of the electrical signals, $ELEC_{DUT}$ and $ELEC_{REF}$, are $i_{dc(DUT)}$ and $i_{dc(REF)}$ respectively, and varying the optical reference signal, $OPT_{REF}$, so that $i_{dc(DUT)}$ and $i_{dc(REF)}$ are substantially equal, (iii) separating the ac component and the dc component of the electrical signals, $ELEC_{DUT}$ and $ELEC_{REF}$, (iv) measuring one or more of the dc components, $i_{dc(DUT)}$ and $i_{dc(REF)}$ of the electrical signals, $ELEC_{DUT}$ and $ELEC_{REF}$, (vi) amplifying one or more of the ac components of the electrical signals, $ELEC_{DUT}$ and $ELEC_{REF}$, (vii) measuring one or more of the amplified ac components of the electrical signals, $ELEC_{DUT}$ and $ELEC_{REF}$, (viii) measuring the ac component of the electrical signal output from the detection means in the absence of $OPT_{DUT}$ and $OPT_{REF}$, so as to provide an indication of the thermal noise power, $N_{TH}$, and (ix) deriving the device noise power contribution, $N_L$, to the optical output signal, $OPT_{DUT}$, from the measured values of the ac components and the dc components of the electrical signals, $ELEC_{DUT}$ and $ELEC_{REF}$.

In a preferred embodiment, the method comprises the steps of;

(i) generating a substantially shot noise limited optical reference signal, $OPT_{REF}$, having a specified wavelength, wherein $OPT_{REF}$ has a linewidth less than a lower frequency limit, (ii) detecting the optical signals, $OPT_{DUT}$ and $OPT_{REF}$, and converting said optical signals into equivalent electrical signals, $ELEC_{DUT}$ and $ELEC_{REF}$ respectively, using detection means, wherein $ELEC_{DUT}$ and $ELEC_{REF}$ each comprise an ac component and a dc component, wherein the dc components of the electrical signals, $ELEC_{DUT}$ and $ELEC_{REF}$, are $i_{dc(DUT)}$ and $i_{dc(REF)}$ respectively, and varying the optical reference signal, $OPT_{REF}$, so that $i_{dc(DUT)}$ and $i_{dc(REF)}$ are substantially equal, (iii) separating the ac component and the dc component of the electrical signals, $ELEC_{DUT}$ and $ELEC_{REF}$, (iv) measuring one or more of the dc components, $i_{dc(DUT)}$ and $i_{dc(REF)}$, of the electrical signals, $ELEC_{DUT}$ and $ELEC_{REF}$, (vi) amplifying one or more of the ac components of the electrical signals, $ELEC_{DUT}$ and $ELEC_{REF}$, (vii) measuring one or more of the amplified ac components of the electrical signals, $ELEC_{DUT}$ and $ELEC_{REF}$, at a plurality of frequencies above the lower frequency limit, (viii) measuring the ac component of the electrical signal output from the detection means at a plurality of frequencies above the lower frequency limit in the absence of $OPT_{DUT}$ and $OPT_{REF}$, so as to provide an indication of the thermal noise power, $N_{TH}$, and (ix) deriving the device noise power contribution, $N_L$, to the optical output signal, $OPT_{DUT}$, from the measured values of the ac components and the dc components of the electrical signals, $ELEC_{DUT}$ and $ELEC_{REF}$.

The method may also comprise the further steps of;

(i) measuring the responsivity of the detection means, $B_{REF\lambda}$, substantially at the wavelength of the optical reference signal, $OPT_{REF}$, (ii) measuring the responsivity of the detection means, $B_{DUT\lambda}$, substantially at the wavelength of the device, (iii) deriving the responsivity of the system, $B_\lambda$, substantially at the wavelength of the device from the measured values of $B_{DUT\lambda}$ and $B_{REF\lambda}$, and (iv) deriving one or more responsivity independent noise power contributions to the total noise power, $N_T$.

The method may also comprise the further steps of;

(i) deriving the average electrical power, $P_{AVG}$, of the device from the measured value of the dc component, $i_{dc(DUT)}$, and (ii) deriving the ratio of the device noise power, $N_L$, to the average electrical power of the device, $P_{AVG}$, so as to provide an indication of the relative intensity noise of the device, $RIN_{DUT}$.

Alternatively, or in addition, the method may also comprise the further steps of;

(i) deriving the average electrical power, $P_{AVG}$, of the device from the measured value of the dc component, $i_{dc(DUT)}$, and (ii) deriving the ratio of the sum of the shot noise power, $N_Q$, and the device noise power, $N_L$, to the average electrical power of the device, $P_{AVG}$.

Alternatively, or in addition, the method may also comprise the further steps of;

(i) deriving the average electrical power, $P_{AVG}$, of the device from the measured value of the dc component, $i_{dc(DUT)}$, and (ii) deriving the ratio of the total noise power of the device, $N_T$, to the average electrical power of the device, $P_{AVG}$, so as to provide an indication of the relative intensity noise of the system, $RIN_{SYS}$.

BRIEF DESCRIPTION OF THE DRAWINGS

The invention will now be described, by example only, with reference to FIG. 1 which shows a system which may be used to measure relative intensity noise (RIN) of a device such as a laser diode.

DESCRIPTION OF THE PREFERRED EMBODIMENTS

Figure 1:
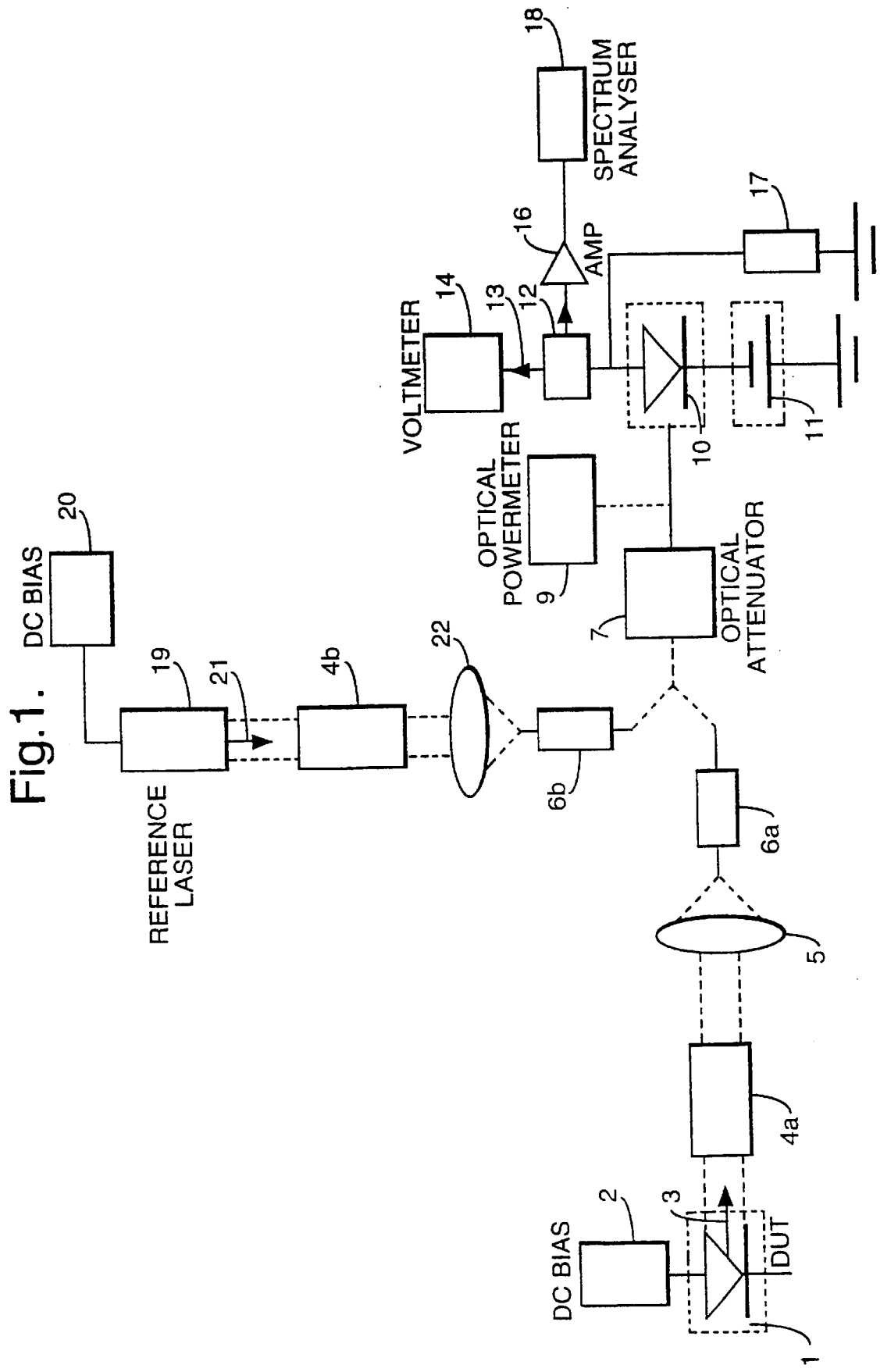

Referring to FIG. 1, a device under test (DUT) 1, having an associated dc bias supply 2, outputs an optical signal 3. The optical output signal is passed through a free space optical isolator 4a. Radiation is focused by means of a lens or lens system 5 through a fibre optical isolator 6a. The radiation is then passed through an optical attenuator 7 which may be required to attenuate the optical power of the signal 3 output from the DUT 1. The optical power of the attenuated signal 8 output from the attenuator 7 may then be measured using an optical power meter 9.

The attenuated optical signal 8 is incident on a photodetector 10 which converts the optical signal into an equivalent electrical signal having ac and dc components. The photodetector 10 has an associated battery supply 11 and a resistor 17 (typically 50 Ω) to ground. The electrical signal output from the photodetector 10 is passed to a bias T filter 12 which separates the ac noise signal from the dc noise signal. The dc component 13 may be measured on a digital voltmeter 14. The ac component 15 of the electrical signal passes through an amplifier 16. The amplified ac signal is then evaluated using a electrical spectrum analyser 18 which provides amplitude versus frequency information, or scans. The amplifier may typically be capable of amplifying the ac electrical signal between 10 dB and 50 dB, and most typically between 30 dB and 50 dB (e.g. 45 dB).

The system also comprises an ultra low noise reference laser 19, having an associated dc supply 20, in order to obtain system calibration information. An optical signal 21 output from the reference laser 19 passes through a free space optical isolator 4b and is focused by a lens or lens system 22 into a fibre optical isolator 6b.

The purpose of the optical isolators 4a, 4b, 6a, 6b is to minimise optical back reflections along the path of the optical signal from the DUT 1 and the path of the optical signal from the reference laser 19. The reflection of the optical signals 3,21 back along their respective incident paths gives rise to additional, unwanted signal noise.

Depending on the nature of the output from the particular device 1,19, either one or the other of the free space optical isolator and the fibre optical isolator may be placed in the optical signals 3,21. If the DUT 1 or the reference laser 19 is an in-fibre device, wherein the output is already coupled to an optical fibre, the signal may be passed through a fibre optic isolator only and a free space optical isolator would not be used. For a free-space device, a free space isolator and a fibre optical isolator in series may be used, as shown in FIG. 1. Alternatively, the output from the device 1 may be coupled straight into a single fibre optical isolator. In any case, more than one fibre optical isolator maybe used, each additional isolator further limiting optical back reflections.

Before the signal 21 from the reference laser 19 is passed to the photodetector 10, it may be attenuated by the optical attenuator 7. At the photodetector 10 the (attenuated) optical signal from the reference laser 19 is converted into an equivalent electrical signal which comprises ac and dc components. As in the case of the DUT signal, the electrical signal output from the photodetector 10 passes through the bias T filter 12 from which the separated ac component of the signal is amplified by the amplifier 16 and is scanned by the spectrum analyser 18. The dc component of the signal is measured on the voltmeter 14.

In order to measure the optical power using the optical power meter 9, the output signal from the attenuator is physically disconnected from the input to the photodetector 10. Typically, the optical power meter may be an electrical multimeter which measures the current and internally converts this to display the equivalent optical power. Alternatively, the current measured by the photodetector may be used directly as a means of determining the optical power.

The spectrum analyser 18 provides information relating to the amplitude of the sine wave (the ac component of the electrical signal output from the photodetector) versus the frequency, and is referred to as a scan. Any time domain electrical phenomenon is made up of one or more sine waves of appropriate frequency, amplitude and phase. This sinusoidal signal can be decomposed into separate sine waves, or spectral components, that may be evaluated independently.

Typically, for RIN measurement of laser devices, a scan will be made at a plurality of frequencies between, for example, 20 MHz (the lower frequency limit) and 20 GHz (the upper frequency limit). It may be preferable for the range of the measurements to be between 10 MHz and 20 GHz. This range of the scan is not necessarily limited to the spectrum analyser range, which for many commercially available spectrum analysers would extend beyond this range, but by the other components in the system. The RIN value may then be calculated at each measurement point across the frequency range of the scan. This may be achieved by transferring the data from each spectrum analyser scan into a spreadsheet or dedicated software program.

A suitable reference laser for use in the system must have an output signal within the detection range of the photodetector 10 included in the system. Typically, semiconductor laser devices used for telecommunications purposes fall into two main wavelength bands, 1300 nm+/−50 nm and 1550 nm+/−50 mn (the 850 nm+/−50 nm wavelength band may also be used, although less commonly). In order to measure RIN values of such devices, a photodetector 10 having a detection range between 1040 nm and 1600 mn (or encompassing the 850 nm+/−50 nm wavelength band) is therefore be suitable for use in the system. A suitable reference laser must therefore have an output wavelength falling within this photodetector detection range.

The laser should also have good frequency stability, typically less than 50 MHz/hr. For example, the reference laser 18 may be a high finesse laser such as a diode pumped Er doped glass ring laser which has an inherent shot noise limited performance. A diode pumped Er doped glass ring laser, commercially available from *Lightwave Electronics* has a frequency drift (at constant temperature) of less than 50 MHz/hour and a frequency stability (itter) of 75 kHz/sec.

Furthermore, it is essential that the reference laser 19 is capable of providing shot noise limited performance (i.e. The total laser noise is dominated by the shot noise contribution) at a suitable optical power level. Shot noise limited performance may be achieved at the required optical power by optically attenuating a higher power signal which itself need not necessarily be shot noise limited. Using optical attenuation of the signal, however, a dominant shot noise contribution to the total noise may be achieved at the required optical power. This optical attenuation technique is described in more detail later.

Another requirement of the reference laser is that the linewidth of the optical output signal 21, (usually defined as the width of the laser signal at half amplitude and commonly quoted in units of Hz) must be less than the lower frequency limit of the scan (e.g. 20 MHz). In practice, however, it is preferable for the linewidth to be much narrower than this and it may typically be less than 5 kHz over 1 ms.

Relative Intensity Noise (RIN) is defined as the ratio of the mean-squared-intensity-fluctuation spectral density of the optical power output to the square of the average optical power and is given by, $$RIN = \frac{\langle \Delta P^2 \rangle}{P^2_{AVG(OPT)}} \text{ (dB/Hz)} \qquad \text{Equation 1}$$

where $\langle \Delta P^2 \rangle$ is the mean-square optical intensity fluctuation (in a 1 Hz bandwidth) at a specified frequency and $P_{AVG(OPT)}$ is the average optical power. The ratio of optical powers is equivalent to the ratio of electrical powers and therefore RIN can also be expressed in terms of detected electrical powers;

$$RIN = \frac{N_{ELEC}}{P_{AVG(ELEC)}} \text{ (dB/Hz)} \quad \text{Equation 2}$$

where $N_{ELEC}$ is the power spectral density of the photocurrent at a specified frequency and $P_{AVG(ELEC)}$ is the average power of the photocurrent. For simplicity, the subscript (ELEC) will hereinafter be dropped and all formulae will be presented in electrical units.

Conventionally, RIN measurement is performed using a fast photodetector, a high gain RF amplifier and an electrical spectrum analyser. RF noise levels associated with laser devices consist of free fundamental noise sources; the laser intensity noise power (primarily due to spontaneous light emissions), thermal noise arising from the electronic components in the measurement system and photonic shot noise.

The total system noise, $N_T(f)$, is the linear summation of the three noise source contributions, $$N_T(f) = N_L(f) + N_Q + N_{TH}(f) \text{ (W/Hz)} \quad \text{Equation 3}$$

where $N_L(f)$ is the laser intensity noise power per Hz, $N_{TH}(f)$ is the thermal noise power per Hz and $N_Q$ is the photonic shot noise power per Hz.

As RIN is defined as the ratio of noise power to average power;

$$RIN_{SYS} = \frac{N_T}{P_{AVG}} \quad \text{Equation 4}$$
$$= \frac{N_L}{P_{AVG}} + \frac{N_Q}{P_{AVG}} + \frac{N_{TH}}{P_{AVG}} \text{ (Hz}^{-1}\text{)}$$

The RIN value of a system ($RIN_{SYS}$) provides an indication of the maximum signal-to-noise ratio obtainable in a lightwave transmission system where the dominant noise source is the laser intensity noise.

In the field of fibre optic communications the measurement of relative intensity noise is of particular importance. In particular, the value of interest is the laser intensity noise power, $N_L$, or the relative intensity noise of the laser, $RIN_{DUT} = N_L/P_{AVG}$, which provides an indication of the contribution to the total noise inherently associated with the particular device under test.

RIN values for a device are typically quoted at a specified optical power and drive current. The optical power is the power measured at the photodetector 10 (i.e. as measured on the optical power meter 9) and the drive current is derived from the dc bias voltage 2 applied to the laser. For each specified optical power and drive current, RIN measurements are determined at a plurality of frequencies within the system frequency range (typically between 10 or 20 MHz and 20 GHz). It is therefore convenient to present RIN levels graphically as a function frequency for a given optical power and drive current specification.

At any one frequency within the measured range, in order to determine the laser intensity noise, $RIN_{DUT}$, the other noise sources contributing to the measured total noise signal need to be determined and subtracted from the measured value of $N_T/P_{AVG}$ (see Equation 4). The value $N_T/P_{AVG}$ is referred to as the relative intensity noise of the system, $RIN_{SYS}$.

From Equation 3, it can be seen that the laser intensity noise power, $N_L$, may be derived if the shot noise, $N_Q$, the thermal noise, $N_{TH}$, and the total system noise power, $N_T$ are measured. The system shown in FIG. 1 may be used to make three measurements or scans to enable the laser intensity noise power, $N_L$, and hence $RIN_{DUT}$, to be derived.

SCAN 1: DUT SCAN TO DETERMINE $N_T$ AND $N_Q$

Firstly, the optical output signal 3 ($OPT_{DUT}$) from the DUT 1 is scanned at the specified optical power. With an optical signal 3 from the DUT 1 passing through the system, the scan on the spectrum analyser 18, measuring the ac component of the electrical signal 15, gives a measure of the total system noise, $N_T$.

The shot noise power contribution, $N_Q$, may be determined by measuring the integrated dc photocurrent, $i_{dc}$, on the digital voltmeter 14 and using the relationship, $$N_Q = 2q\, i_{dc} R \quad \text{Equation 5}$$

where q is the electron charge ($1.6 \times 10^{-19}$ C) and R is the photodetector load resistance. The average power, $P_{AVG}$, can also be determined using this value of $i_{dc}$, $$P_{AVG} = i_{dc}^2 R \quad \text{Equation 6}$$

SCAN 2: DARK LEVEL SCAN TO DETERMINE $N_{TH}$

Secondly, a measurement or scan is made with the signal 3 from the DUT 1 blocked (or the DUT turned off) in order to determine the value of the thermal noise power, $N_{TH}$. This is referred to as a dark level scan and may be obtained by breaking any connection within the system which prevents a signal 3 from the DUT 1 reaching the photodetector 10. For example, the connection between the optical attenuator 7 and the photodetector 10 may be broken. With no radiation from the DUT 1 passing through the system, the noise power measured at the spectrum analyser 18 consists only of a thermal noise power contribution, $N_{TH}$.

SCAN 3: REFERENCE LASER SCAN TO DETERMINE THE SYSTEM CALIBRATION FACTOR

Finally, a third scan is made with an optical output signal ($OPT_{REF}$) 21 from the reference laser 19 passing through the system and the optical output signal 3 from the DUT 1 blocked or the DUT turned off. The reference laser scan enables system calibration to be accounted for. As the thermal and system noise powers ($N_{TH}$ and $N_T$) are measured using the spectrum analyser 18 while the shot noise power ($N_Q$) is calculated from the measured dc photocurrent, different calibration factors need to be employed to allow for the different origins of the measurements.

For this third scan, it is essential that the shot noise limited optical signal provided by the reference laser is shot noise matched to the DUT in the initial scan (scan 1). The shot noise associated with the reference laser signal will generate a flat noise level over the entire frequency span on the spectrum analyser 18, although this will not actually be observed due to the effect of the system responsivity. The magnitude of the dc photocurrent measured on the voltmeter 14 provides an indication of the noise power ($N_Q$) associated with the reference laser. This may be adjusted by varying the dc optical power of the reference laser, which may be varied by the dc bias supply 20. Shot noise matching is achieved by ensuring the dc photocurrent measured for the reference laser scan is equal to the dc photocurrent measured for the initial DUT scan and this may be achieved by varying the dc bias supply 20.

During all three scans it is important that the measurement parameters, such as the spectrum analyser resolution and the bandwidth, remain unchanged. Allowing for system calibration, the measured reference laser noise power, $N_{REF}$, (scan 3) is given by;

$$N_{REF} = (N_{TH} \times CAL) + (N_Q \times CAL) \quad \text{Equation 7}$$

where CAL is the system calibration factor. The dark level noise power, $N_{DARK}$, measured in the dark level scan (scan 2) is given by, $$N_{DARK} = (N_{TH} \times CAL) \quad \text{Equation 8}$$

and the total noise power measured for the DUT scan (scan 1) is given by, $$N_T = (N_{TH} \times CAL) + (N_Q \times CAL) + (N_L \times CAL) \quad \text{Equation 9}$$

From the three scans, the system calibration factor (CAL), the shot noise power ($N_Q$), the thermal noise power ($N_{TH}$) and the total system noise power ($N_T$) can be derived at each measurement point across the frequency range of the spectrum analyser 18. The laser intensity noise power, $N_L$, and the relative intensity noise, $RIN_{DUT}$, may then be calculated as follows (all terms are linear unless otherwise stated).

The measured dark level noise power Equation 8) is subtracted from the measured reference laser noise power (Equation 7), $$(N_{REF} - N_{DARK}) = (N_{TH} \times CAL) + (N_Q \times CAL) - (N_{TH} \times CAL) \text{Equation 10}$$

However, the shot noise power, $N_Q$, can be determined from the measured dc photocurrent, idc, (Equation 3) and therefore, $$CAL = \frac{(N_{REF} - N_{DARK})}{2qi_{dc}R} \quad \text{Equation 11}$$

As the reference laser operates at a fixed wavelength and the device under test may be operating anywhere within a range of wavelengths, for example the range for telecommunications, an adjustment factor needs to be incorporated into the system calibration factor, CAL, to take into account detector responsivity differences. This allows the system calibration factor to be corrected for the wavelength of the DUT. Variations in detector frequency response with respect to wavelength need to be established as minimal to enable accurate adjustment of the system calibration factor. The responsivity factor, $B\lambda$, is given by;

$$B_\lambda = \frac{B_{DUT\lambda}^2}{B_{REF\lambda}^2}$$

where $B_{DUT\lambda}$ is the responsivity of the detector at the device under test wavelength, $\lambda$, and $B_{REF\lambda}$ is the responsivity of the reference laser (fixed at one wavelength).

The responsivities of the detector at the wavelengths of interest can be derived from the measured optical power, $P_{AVG(OPT)}$, at the input to the detector and the resultant photocurrent, $i_{dc}$, using the following relationship;

$$B = \frac{i_{dc}}{P_{AVG(OPT)}}$$

The system calibration factor (Equation 11) therefore becomes;

$$CAL' = \left[\frac{B_{DUT\lambda}^2}{B_{REF\lambda}^2}\right]\left[\frac{(N_{REF} - N_{DARK})}{2qi_{dc}R}\right] \quad \text{Equation 12}$$

This system calibration factor (CAL') accounts for the responsivity, the gain, the noise figure, the resolution bandwidth of the system across the whole frequency range of the measurement. Incorporating the newly derived system calibration factor, CAL', enables a responsivity independent value of $N_L$ to be determined in the following way.

The reference laser noise power, $N_{REF}$, (Equation 7) is subtracted from the total noise power measured for the DUT scan, $N_T$, (Equation 9);

$$(N_T - N_{REF}) = (N_{TH} \times CAL') + (N_Q \times CAL') + (N_L \times CAL') - (N_{TH} \times CAL') + (N_Q \times CAL') = (N_L \times CAL')$$

The responsivity independent laser intensity noise power, $N_L$, can therefore be determined using the measured values of $N_T$ and $N_{REF}$ and the system calibration factor, CAL', derived in Equation 12;

$$N_L = \frac{(N_T - N_{REF})}{CAL'}$$

To obtain the laser intensity noise level of the DUT, $RIN_{DUT}$, across the frequency range of interest, the laser intensity noise power $N_L$ determined at each frequency is divided by the average electrical power (Equation 4), $$RIN_{DUT} = \frac{N_L}{i_{dc}^2 R} \, (\text{Hz}^{-1}) \text{ or}$$

$$RIN_{DUT} = 10 LOG_{10}\left[\frac{N_L}{i_{dc}^2 R}\right] \, (\text{dB Hz}^{-1})$$

stating the incident optical power on the detector and the detector responsivity, $B_{DUT\lambda}$. Due to the complexity of existing RIN measurement systems, involving several critical components which themselves need to be assessed over a number of parameters, the calibration process is complex, time consuming and can be costly. By incorporating a reference laser 18 into the system, however, the system calibration process is simplified and may be repeated frequently.

ATTENUATION TECHNIQUE

Although the reference laser 19 incorporated in the system may inherently have a shot noise limited performance at the required optical power, a higher power reference laser signal, which is not itself shot noise limited, may be attenuated to obtain the required shot noise limited signal (i.e. signal 8 in FIG. 1).

In the general case, for a laser output signal of optical power $P_{AVG}$ falling on a photodetector of responsivity $\beta$, the contributions to the total noise associated with the signal are the shot noise current, the laser noise current and the thermal noise current The shot noise current is given by $(2e\beta P_{AVG})^{1/2}$, the laser spontaneous noise current is $\beta \Delta P_L$, where $\Delta P_L$ is the laser optical power, and $\Delta i_{TH}$ is the thermal noise current. The total noise power, $\Delta P_T$, is therefore given by;

$$\Delta P_T = [2e\beta P_{AVG} + \beta^2 \Delta P_L^2 + \Delta i_{TH}^2]R$$

If the signal is amplified (optical gain A), the total noise power becomes;

$$\Delta P_T = [2e\beta A\, P_{AVG} + \beta^2 A^2 \Delta P_L^2 + \Delta i_{TH}^2]R + [A^2 \Delta i_Q^2]R,$$

where $\Delta i_Q$ is the shot noise current. The $(2e\beta A\, P_{AVG})$ term is the newly derived shot noise (i.e. due to the attenuated optical power) and the last term, $[A^2 \Delta i_Q^2]R$, arises as the original shot noise is also amplified. The original shot noise therefore sees the same amplification ($A^2$) as the spontaneous laser noise. Therefore, on amplification the noise contribution arising from the new derived shot noise cannot be discerned above the laser spontaneous noise.

However, using an optical attenuation, D, the total noise power, $\Delta P_T$, becomes;

$$\Delta P_T = \left[\frac{2e\beta A P_{AVG}}{D} + \frac{\beta^2 \Delta P_L^2}{D} + \Delta i_{TH}^2\right]R + \left[\frac{\Delta i_Q^2}{D^2}\right]R$$

In this case, the newly derived shot noise term dominates over the laser spontaneous noise term by the square of the attenuation, D. Hence, by using the attenuation technique, it is possible to reduce uncertainties in the spontaneous noise content of the reference laser source in relation to the optical power and the shot noise.

For example, by attenuating the incident light by a factor of 100 the shot noise power will decrease by a factor of 100, whereas the spontaneous noise power will decrease by a factor of $100^2$. Therefore, if the shot noise and spontaneous noise contributions from the unattenuated laser are equal, after the signal is attenuated there will be a 20 dB difference in their levels. In the case of the Er doped glass ring reference laser, the performance is shot noise limited in any case and, as the spontaneous noise power will be negligible, it provides a reliable calibration standard.

Depending on the particular reference laser incorporated in the system, it may be essential to attenuate the reference signal in order to ensure shot noise limited reference laser performance at the required optical power.

RIN measurement is made for a device operating at a specified optical power and drive current (determined by the bias voltage) and in practice the measurement may be required for a number of different optical powers. The optical power output of the device 1 may be varied by altering the dc bias voltage supply 2 applied to the device. However, varying the dc bias also alters the noise level of the device signal and therefore introduces a discrepancy between noise level measurements made at different optical powers. As shown in FIG. 1, the optical attenuator 6 may therefore be used to attenuate the optical signal 3 output from the DUT 1 to enable noise level measurements to be obtained at different powers without disrupting the device signal.

The optical attenuator 7 may therefore be used to serve several purposes. It may be used to optically attenuate the reference laser output signal 21 so as to provide a shot noise limited reference signal. Also, it may be used to allow RIN measurement of the DUT 1 at a variety of optical powers. Furthermore, optical power levels required outside the range of the photodetector may be assessed, within limits, by using optical attenuation. This may be achieved by measuring a number of RIN levels at different attenuation levels within the detector power range and, as the spontaneous noise varies in a linear way, using least squares line fitting techniques to extrapolate higher and lower values of $\text{RIN}_{DUT}$.

In summary, the RIN measurement comprises three scans; an initial DUT scan, with the DUT operating at the specified optical power, a second dark level scan, with no signal from the DUT passing through the system, and finally a third reference laser (again with no signal from the DUT passing through the system). For the third scan, the dc component measured on the voltmeter, $i_{dc}$, is matched to the dc component $i_{dc}$ measured for the initial DUT scan.

Although it may be preferable to complete the three scans in this order, in practice the order may be rearranged. For example, an initial dark level scan may be made before the device under test is turned on followed by the reference laser scan. In this case the third scan will be that of the DUT, whereby the dc component measured on the voltmeter, $i_{dc}$, is matched to the value of $i_{dc}$ measured for the reference laser scan, again ensuring the reference laser scan and DUT scan are shot noise matched. This sequence may be less convenient, however, as RIN measurements for the device under test is often required at a number of different optical powers.

One of the advantages of incorporating the reference laser is that, due to the flat frequency response, non linearitys in the system can be calculated and compensated for when assessing the device under test Uncertainty in the subtraction of the shot noise level is also minimised due to the shot noise limited performance of the reference laser. The system calibration can be calculated simply and frequently which reduces systematic errors in the measurement.

The system may be used to measure RIN values for a laser device of any wavelength, providing the photodetector included in the system has a suitable wavelength detection range and an appropriate reference laser is available. The system may therefore be used to measure RIN values for a continuous wave or a pulsed laser device, and is particularly useful for measuring RIN values of semiconductor laser diode devices, as used for telecommunication applications.

The means for generating an optical reference signal may be any optical broadband noise source (i.e. broadband over the frequency range of interest), and not just a laser. For example, the optical reference signal may be provided by an Erbium doped fibre amplifier combined with a narrowband filter, yielding a flat noise spectrum up to a frequency limit determined by the filter being used. This could form a secondary noise standard which could be traceable via the reference laser system which forms the primary standard.

The system may also be used to measure noise figure of optical amplifiers and may be potentially useful for microwave noise level calibration.

What is claimed is:

1. A system for measuring one or more noise contributions to an optical output signal, $\text{OPT}_{DUT}$, (3) from a device (1) comprising;

means (19) for generating a broadband, substantially shot noise limited optical reference signal, $\text{OPT}_{REF}$, (21), detection means (10) for receiving the optical signals, $\text{OPT}_{DUT}$ and $\text{OPT}_{REF}$, (3, 21) and converting said optical signals into equivalent electrical signals, $\text{ELEC}_{DUT}$ and $\text{ELEC}_{REF}$ respectively, each comprising an ac component and a dc component (13), wherein the dc components (13) of the electrical signals, $\text{ELEC}_{DUT}$ and $\text{ELEC}_{REF}$, are substantially equal, means (12) for separating the ac components and the dc components (13) of the electrical signals, $\text{ELEC}_{DUT}$ and $\text{ELEC}_{REF}$, means (14) for measuring the dc components of the electrical signals, $\text{ELEC}_{DUT}$ and $\text{ELEC}_{REF}$, means (16) for amplifying the ac components of the electrical signals and means (18) for measuring the amplified ac components of the electrical signals at a plurality of frequencies, whereby the measurement of at least one of the ac components or dc components (13) of the electrical signals, $ELEC_{DUT}$ and $ELEC_{REF}$, provides an indication of one or more of the noise contributions to the optical output signal, $OPT_{DUT}$ (3).

2. The system of claim 1, characterised in that the system comprises means (19) for generating a substantially shot noise limited optical reference signal (21), $OPT_{REF}$, having a linewidth less than a lower frequency limit, wherein $OPT_{REF}$ and $OPT_{DUT}$ (3, 21) are substantially shot noise matched.

3. The system of claim 1, and also comprising first optical isolation means (4a, 6a) through which the optical signal, $OPT_{DUT}$, is transmitted so as to minimise reflection of the optical signal $OPT_{DUT}$ (3).

4. The system of claim 1, and also comprising second optical isolation means (4b, 6b) through which the optical signal, $OPT_{REF}$, (21) is transmitted so as to minimise reflection of the optical signal $OPT_{REF}$ (21).

5. The system of claim 1 comprising;
at least one of a first free space optical isolator component (4a) and a first fibre optical isolator component (6a) through which the optical signal. $OPT_{DUT}$, (3) is transmitted and
at least one of a second free space optical isolator component (4b) and a second fibre optical isolator component (6b) through which the optical signal, $OPT_{REF}$, (21) is transmitted.

6. The system claim 1 wherein the means for generating an optical reference signal, $OPT_{REF}$, (21) comprises a reference laser (19).

7. The system of claim 6 wherein the reference laser (19) is a diode pumped Er doped glass ring laser.

8. The system of claim 6, and further comprising attenuation means (7) for attenuating at least one of the optical signal output from the device, $OPT_{DUT}$, (3) and the optical signal output from the reference laser, $OPT_{REF}$ (21).

9. The system of claim 8, wherein the attenuation means is an optical attenuator (7) capable of providing an attenuation of between 0 and 60 dB.

10. The system claim 9 wherein the detection means is a photodetector (10).

11. The system of claim 10 wherein the means for measuring the amplified ac component of the electrical signal is a spectrum analyser (18).

12. The system of claim 11 wherein the means for amplifying the ac components of the electrical signals is an amplifier (16) capable of providing an amplification of between 10 dB and 50 dB.

13. The system of claim 12 wherein the means for amplifying the ac components of the electrical signals is an amplifier (16) capable of providing an amplification of between 30 dB and 50 dB.

14. The system of claim 12 wherein the means for measuring the dc components (13) of the electrical signals is a voltmeter (14).

15. The system of claim 1, comprising an Erbium doped fibre amplifier for generating a broadband, substantially shot noise limited optical reference signal (3), $OPT_{REF}$.

16. A method for determining the device noise power contribution, $N_L$, to the total noise power, $N_T$, of an optical signal (3), $OPT_{DUT}$, output from a device (1), having a wavelength λ, using apparatus contributing a thermal noise power, $N_{TH}$, to the total noise power, $N_T$, said total noise power also comprising a shot noise power contribution, $N_Q$, comprising the steps of;

(i) generating a broadband, substantially shot noise limited optical reference signal (21), $OPT_{REF}$, (ii) detecting the optical signals, $OPT_{DUT}$ and $OPT_{REF}$, (3,21) and converting said optical signals into equivalent electrical signals, $ELEC_{DUT}$ and $ELEC_{REF}$ respectively, using detection means (10), wherein $ELEC_{DUT}$ and $ELEC_{REF}$ each comprise an ac component and a dc component (13), wherein the dc components of the electrical signals, $ELEC_{DUT}$ and $ELEC_{REF}$, are $i_{dc(DUT)}$ and $i_{dc(REF)}$ respectively, and varying the optical reference signal, $OPT_{REF}$, (21) so that $i_{dc(DUT)}$ and $i_{dc(REF)}$ are substantially equal, (iii) separating the ac component and the dc component (13) of the electrical signals, $ELEC_{DUT}$ and $ELEC_{REF}$, (iv) measuring one or more of the dc components, $i_{dc(DUT)}$ and $i_{dc(REF)}$, of the electrical signals, $ELEC_{DUT}$ and $ELEC_{REF}$, (vi) amplifying one or more of the ac components of the electrical signals, $ELEC_{DUT}$ and $ELEC_{REF}$, (vii) measuring one or more of the amplified ac components of the electrical signals, $ELEC_{DUT}$ and $ELEC_{REF}$, (viii) measuring the ac component of the electrical signal output from the detection means (10) in the absence of $OPT_{DUT}$ and $OPT_{REF}$, (3, 21) so as to provide an indication of the thermal noise power, $N_{TH}$, and (ix) deriving the device noise power contribution, $N_L$, to the optical output signal, $OPT_{DUT}$, (3, 21) from the measured values of the ac components and the dc components of the electrical signals, $ELEC_{DUT}$ and $ELEC_{REF}$.

17. The method of claim 16, comprising the step of;
(i) generating a substantially shot noise limited optical reference signal, $OPT_{REF}$, (21) having a specified wavelength, wherein $OPT_{DUT}$ and $OPT_{REF}$ (3, 21) are shot noise matched and wherein $OPT_{REF}$ (21) has a linewidth less than a lower frequency limit.

18. The method of claim 16, and also comprising the further steps of;
(i) measuring the responsivity of the detection means, $B_{REFλ}$, substantially at the wavelength of the optical reference signal, $OPT_{REF}$ (21),
(ii) measuring the responsivity of the detection means (10), $B_{DUTλ}$, substantially at the wavelength of the device (1),
(iii) deriving the responsivity of the system, $B_λ$, substantially at the wavelength of the device (1) from the measured values of $B_{DUTλ}$ and $B_{REFλ}$, and
(iv) deriving at least one responsivity independent noise power contributions to the total noise power, $N_T$.

19. The method claim 16, and also comprising the further steps of;
(i) deriving the average electrical power, $P_{AVG}$, of the device (1) from the measured value of the dc component, $i_{dc(DUT)}$, (13) and
(ii) deriving the ratio of the device noise power, $N_L$, to the average electrical power of the device (1), $P_{AVG}$,
so as to provide an indication of the relative intensity noise of the device (1), $RIN_{DUT}$.

20. The method of claim 16, and also comprising the further steps of;
   (i) deriving the average electrical power, $P_{AVG}$, of the device (1) from the measured value of the dc component, $i_{dc(DUT)}$, (13) and
   (ii) deriving the ratio of the sum of the shot noise power, $N_Q$, and the device noise power, $N_L$, to the average electrical power of the device (1), $P_{AVG}$.

21. The method claim 16, and also comprising the further steps of;
   (i) deriving the average electrical power, $P_{AVG}$, of the device (1) from the measured value of the dc component, $i_{dc(DUT)}$, (13) and
   (ii) deriving the ratio of the total noise power of the device (1), $N_T$, to the average electrical power of the device (1), $P_{AVG}$,
so as to provide an indication of the relative intensity noise of the system, $RIN_{SYS}$.

* * * * *